United States Patent
Shu et al.

[11] Patent Number: 5,892,472
[45] Date of Patent: Apr. 6, 1999

[54] PROCESSOR CONTROLLED ANALOG-TO-DIGITAL CONVERTER CIRCUIT

[75] Inventors: Tzi-Hsiung Shu, Melbourne; Kantilal Bacrania, Palm Bay, both of Fla.

[73] Assignee: Harris Corporation, Palm Bay, Fla.

[21] Appl. No.: 885,274

[22] Filed: Jun. 30, 1997

[51] Int. Cl.$^6$ .................................................. H03M 1/18
[52] U.S. Cl. ............................................................ 341/139
[58] Field of Search ............................................... 341/139

[56] References Cited

U.S. PATENT DOCUMENTS

| | | | |
|---|---|---|---|
| 4,429,285 | 1/1984 | Bradshaw | 341/143 |
| 5,134,401 | 7/1992 | McCartney et al. | 341/143 |
| 5,144,311 | 9/1992 | Buhler et al. | 341/166 |
| 5,146,223 | 9/1992 | Muto | 341/118 |
| 5,363,102 | 11/1994 | Ferguson, Jr. | 341/172 |
| 5,541,600 | 7/1996 | Blumenkrantz et al. | 341/139 |
| 5,691,720 | 11/1997 | Wang et al. | 341/143 |

OTHER PUBLICATIONS

Burr–Brown Data Sheet ADS1210/1211 Apr. 1997 printing, pp. 1 and 9.

*Primary Examiner*—Howard L. Williams
*Attorney, Agent, or Firm*—Allen, Dyer, Doppelt, Milbrath & Gilchrist, P.A.

[57] ABSTRACT

Then circuit includes an analog-to-digital converter (ADC); and one or more switched capacitor amplifier stages connected together in series with a first switched capacitor amplifier stage for receiving the analog input signal, and a last switched capacitor amplifier stage connected to the ADC. Moreover, each of the plurality of switched capacitor amplifier stages preferably has a selectable gain to permit control of an overall gain of the analog input signal upstream of the ADC. In addition, the first stage may also serve as a sample and hold circuit for the ADC. In one embodiment, the circuit may comprise an integrated circuit substrate on which the ADC and the plurality of switched capacitor amplifiers are formed so that the analog-to-digital converter is a monolithic integrated circuit. The circuit may also control the gain of each of the plurality of switched capacitor amplifier stages based upon a digital gain control word. A clock is preferably operatively connected to the ADC and the plurality of switched capacitor amplifier stages. Accordingly, gain control word changes cause relatively rapid changes in the overall gain.

41 Claims, 4 Drawing Sheets

PROCESSOR CONTROLLED ANALOG-TO-DIGITAL CONVERTER CIRCUIT

FIELD OF THE INVENTION

The present invention relates to the field of electronics, and, more particularly, to an analog-to-digital converter and associated methods.

BACKGROUND OF THE INVENTION

Analog-to-digital converters (ADCs) are widely used to process electrical signals in many electronic applications. An integrated circuit ADC typically accepts an analog input voltage signal and converts the signal into a digital form as the output. A modern digital communication system, such as for a cellular telephone base station, for example, may often require an ADC with a high resolution of greater than 12 bits, a bandwidth greater than 200 MHz, and low power consumption and low distortion for improved overall system performance.

A pipelined ADC includes a series of subconverter stages with each stage including a flash analog-to-digital converter, a digital-to-analog converter (DAC) and an interstage amplifier connecting the DAC to an adjacent stage. The last stage typically includes only a flash ADC. A multi-step ADC may include one or more similar subconverter stages which are sequentially reused in generating the digital output signal.

The analog signal which is input to an ADC may have different ranges. For example, for communications applications, the analog input signal may cover only a portion of the range of the ADC. In other words, a large portion of the available resolution of the ADC may be wasted. To address such a shortcoming, a prior art circuit 10 as shown in FIG. 1 may be used which includes an integrated circuit programmable gain amplifier (PGA) 11 connected to the input of an ADC chip 12 to thereby control the level of the input analog signal for full resolution by the ADC. As shown, the PGA 11 is also typically a separate integrated circuit from the integrated circuit ADC 12. Accordingly, the overall circuit 10 is relatively large. U.S. Pat. No. 5,144,311 to Buhler et al. also discloses a similar circuit including a portion which comprises an ADC with an optional PGA for adjusting the input level to the ADC.

The gain of a typical PGA 11 as used in the illustrated prior art circuit 10 is either voltage-controlled, or controlled by a digital word including gain setting bits. Of course, such a typical PGA 11 has a limited gain-bandwidth product. Accordingly, as shown in the plots 14, 16 of FIGS. 2 and 3, respectively, the prior art circuit 10 may have a relatively slow response time to change the gain setting. The gain change may be slow as compared to the conversion cycle time of the ADC 12. In other words, the gain cannot be quickly changed, and accuracy is therefore sacrificed.

SUMMARY OF THE INVENTION

In view of the foregoing background, it is therefore an object of the present invention to provide an ADC circuit having input gain control and associated methods which provides fast and accurate changes to the gain.

It is another object of the present invention to provide an ADC circuit having a controllable input gain which is readily manufactured in a compact form providing programmable gain for the signal input.

These and other objects, advantages and features in accordance with the one embodiment of the present invention are provided by a circuit comprising an analog-to-digital converter (ADC), and one or more switched capacitor amplifier stages connected together in series. A first switched capacitor amplifier stage is for receiving the analog input signal, and a last switched capacitor amplifier stage is connected to the ADC. Moreover, each of the switched capacitor amplifier stages preferably has a selectable gain to permit control of an overall gain of the analog input signal upstream of the ADC. In addition, the first stage may also serve as a sample and hold circuit for the ADC. In one embodiment, the circuit may comprise an integrated circuit substrate on which the ADC and the switched capacitor amplifiers are formed so that the analog-to-digital converter is a monolithic integrated circuit.

The circuit may also comprise gain control interface means for controlling the gain of each of the switched capacitor amplifier stages based upon a digital gain control word. The gain control interface means preferably comprises latching and aligning means for latching and aligning the digital gain control word to the switched capacitor amplifier stages. A clock is preferably operatively connected to the ADC and the switched capacitor amplifier stages. Accordingly, one important advantage of the present invention is that gain control word changes cause relatively rapid changes in the overall gain.

Each of the switched capacitor amplifiers preferably comprises an amplifier, a plurality of capacitors connectable to at least one input of the amplifier, and at least one switch for selectively connecting the capacitors responsive to the gain control interface means. The capacitors may preferably comprise first and second capacitors having a predetermined ratio to thereby provide corresponding selectable first and second gains. For example, the first and second capacitors may have a common value to thereby provide selectable gains of one or two. In addition, each of the switched capacitor amplifier stages may have a controllable gain of not greater than about two for providing relatively fast settling in view of a finite gain-bandwidth product.

Another important aspect of the present invention is that the first switched capacitor amplifier stage may be configured for open loop sampling. Accordingly, a wide bandwidth can be accommodated by the present invention.

According to yet another important aspect of the invention, the circuit may preferably further comprise a processor for determining the digital gain control word based upon an output of the ADC. The processor may include ADC range optimizing means for determining the digital gain control word so as to use a relatively large range of the ADC. The processor may also include noise reduction means for generating a digital gain control word to increase the gain of the earlier switched capacitor amplifier stages for reducing noise when an increase in the overall gain is desired. Conversely, the noise reduction means preferably generates the digital gain control word so as to decrease the gain of the latter switched capacitor amplifier stages for reducing noise when a decrease in the overall gain is desired.

The circuit may also include offset cancellation means downstream from the ADC. Since changing the stage gains may affect the offset, the processor may also include offset control means cooperating with the offset cancellation means for cancelling the offsets.

A method aspect of the present invention is for performing an analog-to-digital conversion and for controlling a gain of an analog input signal upstream of the analog-to-digital conversion. The method preferably comprises the steps of: performing the analog-to-digital conversion; providing at least one switched capacitor amplifier stage operatively connected between the analog input signal upstream of the analog-to-digital conversion, the at least one switched capacitor amplifier stage having a selectable gain; and selecting a gain of the at least one switched capacitor amplifier. The step of selecting the gain preferably comprises selecting the gain based upon a clock. The selecting step may also comprise selecting the gain so as to use a relatively large range for the analog-to-digital conversion and to increase the earlier stages first to reduce noise.

BRIEF DESCRIPTION OF THE INVENTION

DETAILED DESCRIPTION OF PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

Figure 1:
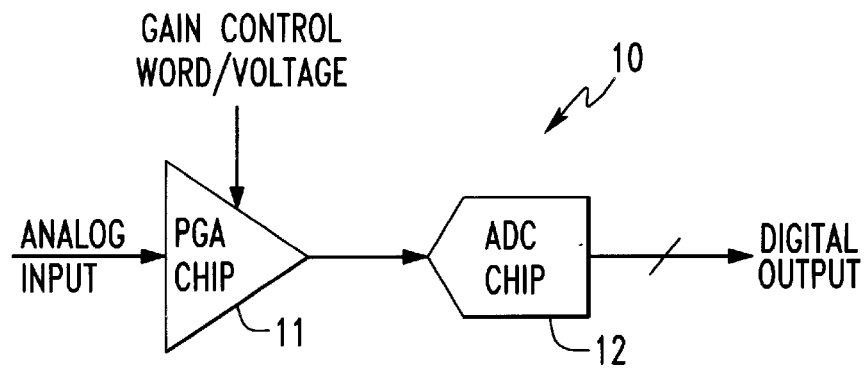
FIG. 1 is a schematic diagram of a prior art ADC circuit and including a PGA for controlling an input signal gain to the ADC.
Figure 2:
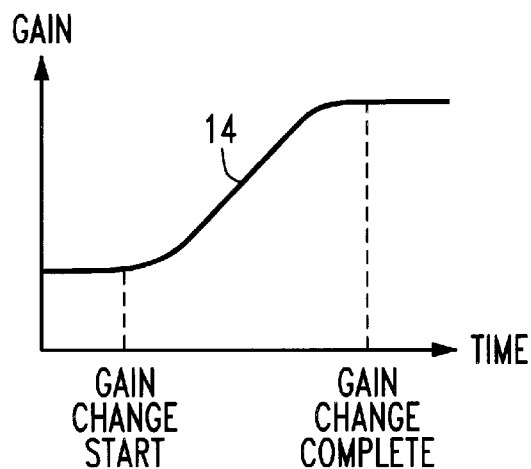
FIG. 2 is a graph of the input signal gain versus time and illustrating the relatively slow increase in input signal gain of the prior art circuit of FIG. 1.
Figure 3:
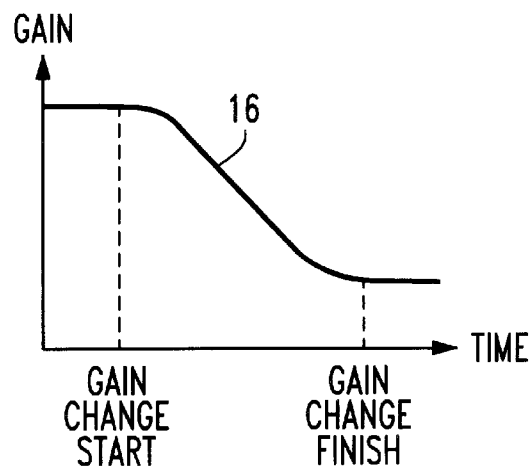
FIG. 3 is a graph of the input signal gain versus time and illustrating the relatively slow decrease in the input signal gain of the prior art circuit of FIG. 1.
Figure 4:
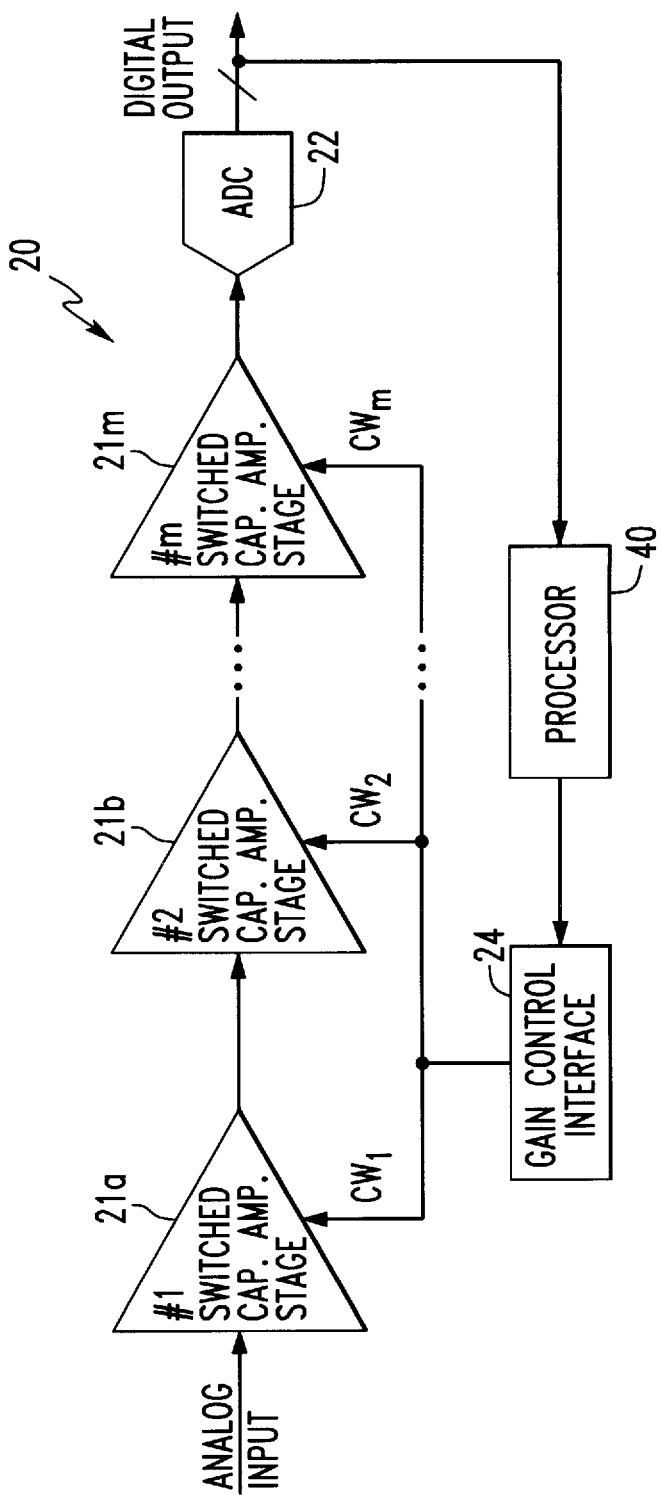
FIG. 4 is a block diagram of an ADC circuit and including a controllable input gain circuit in accordance with the present invention.
Figure 5:
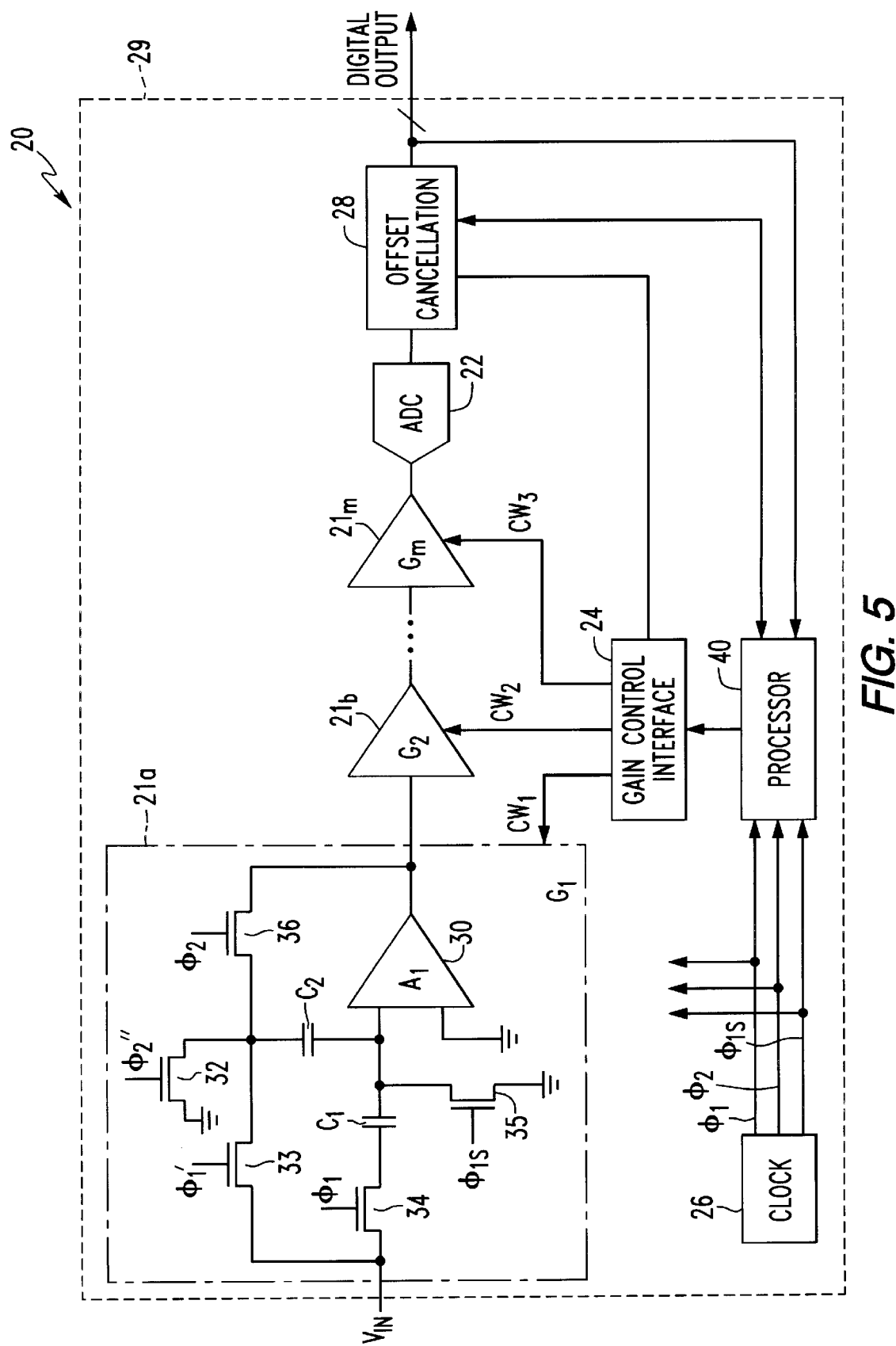
FIG. 5 is a more detailed schematic block diagram of the circuit as shown in FIG. 4.

Referring first to FIGS. 4 and 5, the circuit 20 in accordance with the present invention is first described. The illustrated circuit 20 includes an analog-to-digital converter (ADC) 22 and a plurality of switched capacitor amplifier stages 21a–21m connected together in series. A first switched capacitor amplifier stage 21a is for receiving the analog input signal Vin, and a last switched capacitor amplifier stage 21m has an output connected to the input of the ADC 22. Each of the plurality of switched capacitor amplifier stages 21a–21m has a selectable gain to permit control of an overall gain of the analog input signal upstream of the ADC 22.

The first stage 21a may also serve as a sample and hold circuit for the ADC 22. In slightly different terms, due to the inherent sampling function of a switched capacitor amplifier circuit, the first stage 21a of the circuit 20 also provides the sample-and-hold function for the ADC 22 as would be readily understood by those skilled in the art.

The circuit 20 also includes gain control interface means 24 for controlling the gain of each of the plurality of switched capacitor amplifier stages 21a–21m based upon a digital gain control word (CW) with control word bits $CW_I$–$CW_m$. Of course, multiple bits may also be used for each stage. The gain control interface means 24 comprises latching and aligning means for latching and aligning the digital gain control word to the plurality of switched capacitor amplifier stages 21a–21m. A clock 26 is operatively connected to the ADC 22 and the plurality of switched capacitor amplifier stages 21a–21m. The gain control word should be latched internally to the clock 26 and passed through a digital delay line, not shown, to align the gain setting with the sampled data and thereby making instant gain changes possible. In other words, important advantages of the present invention are that gain control word changes cause relatively rapid changes in the overall gain, and that the gain changes can be made on-the-fly during operation of the circuit 20.

As shown with particular reference to FIG. 4, the switched capacitor amplifier 21a comprises an amplifier 30, two capacitors C1, C2 connectable to an input of the amplifier, and a plurality of switching transistors 32–36 for selectively connecting the capacitors responsive to the gain control interface means 24. The illustrated transistors 32–36 are field-effect transistors controlled through their respective gates as would be readily understood by those skilled in the art. Those of skill in the art will also readily appreciate that other semiconductor devices and circuits may be used for performing the switching functions as described.

Open loop sampling is provided in accordance with another feature of the circuit 20 of the present invention. The open loop sampling is provided by the arrangement of transistors 34 and 35 with capacitor C1 as would be readily understood by those skilled in the art. The open loop sampling permits a greater operating bandwidth, such as may become important when operating the circuit 20, such as, for example, at high input frequencies of 200 MHz and above. The stages 21b–21m downstream from the first stage 21a need not be open loop.

Clock signals $\Phi_1$ and $\Phi_2$ are conventional first and second phase clock signals as would be readily understood by those skilled in the art. Clock signal $\Phi_{1S}$ is also a conventional derived clock signal. Signals $\Phi_1'$ and $\Phi_1''$ are clocked phases controlled by the digital bit $CW_1$ from the gain control interface means 24. Only one of the two lines will be activated at the proper time.

For example, to permit selection of either a 0 or 6 dB gain stage, let C1=C2 for 0 dB gain with $\Phi_1'$ disabled. Then capacitor C1 samples input voltage while capacitor C2 samples ground (0 V). During the holding phase the charge stored on capacitor C1 is transferred to capacitor C2, and assuming ideal elements the effective stage gain is:

$$A = \frac{C_1}{C_2} = 1, \text{ which is 0 dB}$$

To set the gain to 6 dB, $\Phi_1''$ is disabled. Both capacitors C1 and C2 sample the input voltage. During the holding phase, the charge transfer occurs and the effective stage gain is given by:

$$A = \frac{C_1 + C_2}{C_2} = 2, \text{ which is 6 dB}$$

The overall selectable gain can be realized by cascading and controlling a number of switched capacitor amplifier stages 21a–21m as illustrated. For example, four such stages may be a useful configuration, although those of skill in the art will recognize that more or less such amplifier stages may be used in other embodiments. The other switched capacitor amplifier stages 21b–21m are similarly constructed to the first stage 21a as described, and, accordingly, the other stages require no further discussion for those skilled in the art.

In one embodiment, the capacitors C1 and C2 may have a predetermined ratio to thereby provide corresponding selectable first and second gains. For example, the first and second capacitors may have a common value to thereby provide selectable gains of one (0 dB) or two (6 dB) as described above. For finer gain control, such as between 0 to 6 dB, the capacitors C1 and C2 can be ratioed. Alternately or in addition, the capacitors C1 and C2 can be further divided into smaller capacitors with the independently controlled switches to achieve multiple gain steps within the stage as would be readily understood by those skilled in the art. As long as the maximum selectable gain of a stage is less than or equal to the other stage gains, such as for example, 6 db, the op-amp settling time will be less than or equal to the other stages. This precludes any conversion rate penalty as discussed below.

Due to the finite gain-bandwidth product of a practically realized op-amp, the maximum selectable stage gain given a fixed settling time requirement is limited. For fast settling, a maximum stage gain of two (6 dB) is typically used. Higher stage gain can be achieved through a trade-off of settling time; hence, the maximum operating clock rate of the amplifier stages 21a–21m and the ADC 22 as would be readily understood by those skilled in the art. More control bits per stage can be used in such a case as would also be readily understood by those skilled in the art.

According to another important aspect of the invention, the circuit 20 may preferably further comprise a processor 40 for determining the digital gain control word based upon an output of the ADC 22. The processor 40 may include ADC range optimizing means for determining the digital gain control word so as to use a relatively large range of the ADC as would be readily understood by those skilled in the art. In other words, by controlling the overall gain of the amplifier stages 21a–21m, the input analog signal may be scaled to take full advantage of the range/resolution of the ADC 22.

Due to noise concerns, a typical gain change strategy is to increase the gain of earlier stages first to the maximum stage gain, then increase the gain of the succeeding stages in sequence. The noise and offset introduced by later stages are divided by the combined gain of the preceding stages, when referred to the input. Accordingly, the processor 40 may also include noise reduction means for generating a digital gain control word to increase the gain of the earlier switched capacitor amplifier stages for reducing noise when an increase in the overall gain is desired. Conversely, the noise reduction means preferably generates the digital gain control word so as to decrease the gain of the latter switched capacitor amplifier stages for reducing noise when a decrease in the overall gain is desired. In addition, each of the switched capacitor amplifier stages 21a–21m may have a controllable gain of not greater than about two for providing relatively fast settling in view of a finite gain-bandwidth product.

The circuit 20 may also include offset cancellation means 28 downstream from the ADC 22 (FIG. 5). Since changing the stage gains may affect the offset, the processor 40 may also include offset control means cooperating with the offset cancellation means for cancelling the offsets as the gains are changed and as would be readily understood by those skilled in the art.

Figure 6:
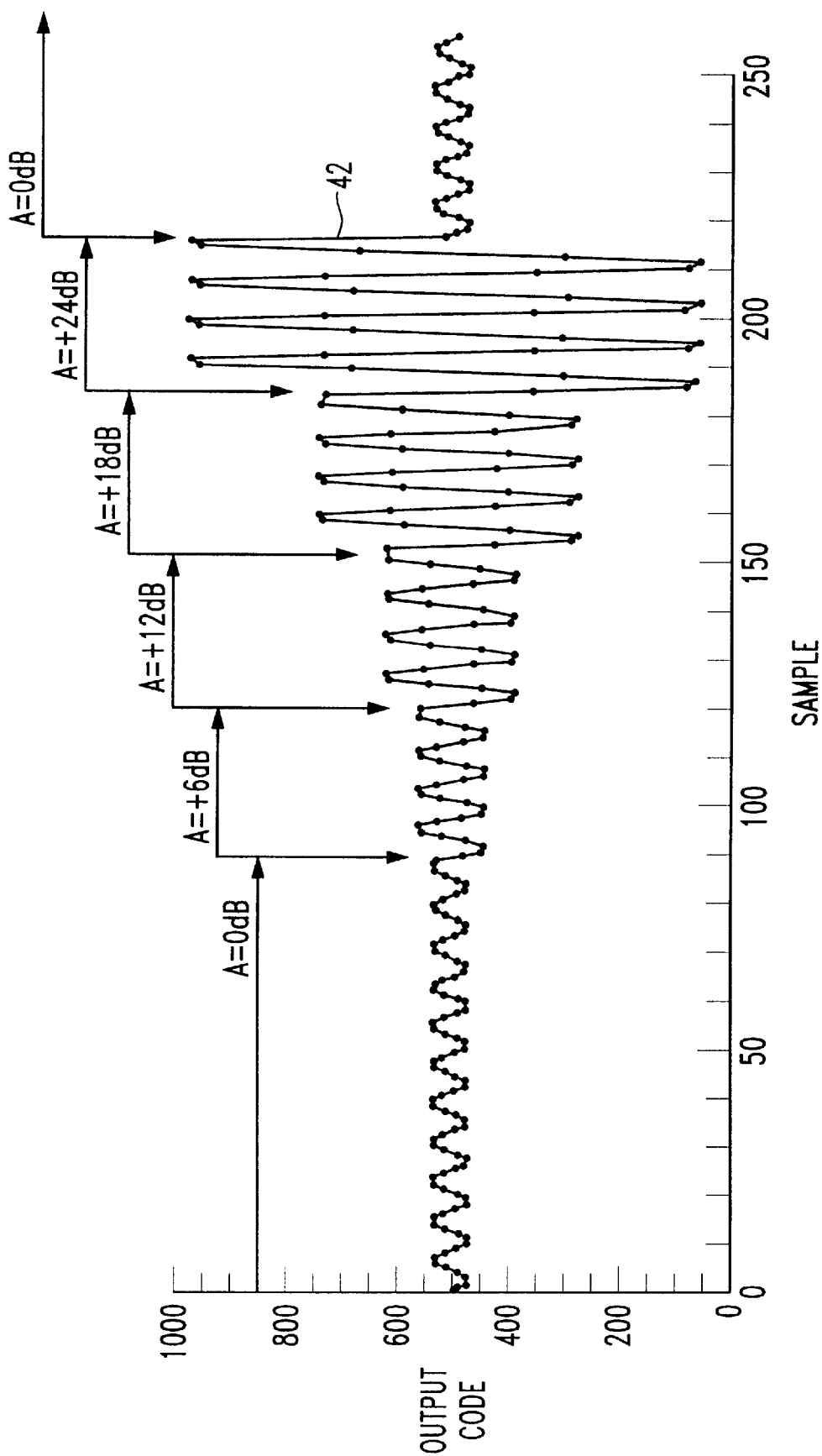
FIG. 6 is a graph of an output signal from the circuit as shown in FIG. 4 illustrating a series of on-the-fly gain changes.

Turning now to the graph of FIG. 6, operation of the circuit 20 in accordance with the present invention is further explained. The output of the ADC 22 responsive to a 5 MHz input signal and sampled at 40 MHz is shown by the plot 42. In the illustrated output plot 42, the overall gain (A) progressively increases in steps from 0 dB to 24 dB in 6 dB increments, thereafter, the gain is changed back to 0 dB. As is readily apparent from the plot 42, the changes in gain occur relatively quickly and can be made on-the-fly.

A method aspect of the present invention is for performing an analog-to-digital conversion and for controlling a gain of an analog input signal upstream of the analog-to-digital conversion. The method preferably comprises the steps of: performing analog-to-digital conversion; providing at least one switched capacitor amplifier stage 21a–21m operatively connected between the analog input signal upstream of the analog-to-digital conversion, the at least one switched capacitor amplifier stage having a selectable gain; and selecting a gain of the at least one switched capacitor amplifier. The step of selecting the gain preferably comprises selecting the gain based upon a clock 26. The selecting step may also comprise selecting the gain so as to use a relatively large range for the analog-to-digital conversion, and to increase the earlier stages first to reduce noise as described in greater detail above.

As shown in the illustrated embodiment of FIG. 5, the circuit 20 may comprise an integrated circuit substrate 29 on which the ADC 22 and the plurality of switched capacitor amplifiers stages 21a–21m are formed so that the circuit is a monolithic integrated circuit. Part or all of the gain control interface means 24 may also be formed on the substrate 29 as would also be readily understood by those skilled in the art. The illustrated processor 40, offset cancellation means 28, and clock 26 may also be included on the integrated circuit substrate 29. In other embodiments, the switched capacitor amplifier stages 21a–21m and the ADC 22 may be individual integrated circuits, or formed from discrete components. Accordingly, many modifications and other embodiments of the invention will come to the mind of one skilled in the art having the benefit of the teachings presented in the foregoing descriptions and the associated drawings. Therefore, it is to be understood that the invention is not to be limited to the specific embodiments disclosed, and that modifications and embodiments are intended to be included within the scope of the appended claims.

That which is claimed is:

1. A circuit for performing an analog-to-digital conversion and for controlling a gain of an analog input signal upstream of the analog-to-digital conversion, said circuit comprising:

an analog-to-digital converter (ADC);

a plurality of switched capacitor amplifier stages connected together in series, a first switched capacitor amplifier stage for receiving the analog input signal and serving as a sample and hold circuit for said ADC, a last switched capacitor amplifier stage connected to said ADC;

each of said plurality of switched capacitor amplifier stages having a selectable gain to permit control of an overall gain of the analog input signal upstream of said ADC;

gain control interface means for controlling the gain of each of said plurality of switched capacitor amplifier stages based upon a digital gain control word; and a processor for determining the digital gain control word based upon an output of said ADC.

2. A circuit according to claim 1 wherein the first switched capacitor amplifier stage is configured for open loop sampling.

3. A circuit according to claim 1 wherein said gain control interface means comprises latching and aligning means for latching and aligning the digital gain control word to said plurality of switched capacitor amplifier stages.

4. A circuit according to claim 1 further comprising a clock operatively connected to said ADC and said plurality of switched capacitor amplifier stages so that gain control word changes cause relatively rapid changes in the overall gain based upon said clock.

5. A circuit according to claim 1 wherein each of said switched capacitor amplifiers comprises:
   an amplifier;
   a plurality of capacitors connectable to at least one input of said amplifier; and
   at least one switch for selectively connecting each of said plurality of capacitors responsive to said gain control interface means.

6. A circuit according to claim 5 wherein said plurality of capacitors comprise first and second capacitors having a predetermined ratio to thereby provide corresponding selectable first and second gains.

7. A circuit according to claim 5 wherein said plurality of capacitors comprise first and second capacitors having a common value to thereby provide selectable gains of one and two.

8. A circuit according to claim 1 wherein said processor comprises ADC range optimizing means for determining the digital gain control word so as to use a relatively large range of said ADC.

9. A circuit according to claim 1 wherein said processor comprises noise reduction means for generating a digital gain control word to increase the gain of earlier switched capacitor amplifier stages for reducing noise when an increase in the overall gain is desired, and for generating the digital gain control word so as to decrease the gain of latter switched capacitor amplifier stages for reducing noise when a decrease in the overall gain is desired.

10. A circuit according to claim 1 further comprising offset cancellation means downstream from said ADC for cancelling an offset; and wherein said processor further comprises offset cancellation control means for controlling said offset cancellation means for cancelling offsets based upon gain changes.

11. A circuit according to claim 1 further comprising an integrated circuit substrate on which said ADC and said plurality of switched capacitor amplifiers are formed so that said circuit is a monolithic integrated circuit.

12. A circuit for performing an analog-to-digital conversion and for controlling a gain of an analog input signal upstream of the analog-to-digital conversion, said circuit comprising:
   an analog-to-digital converter (ADC);
   at least one switched capacitor amplifier stage operatively connected between the analog input signal and said ADC;
   said at least one switched capacitor amplifier stage having a selectable gain;
   gain control interface means for controlling the gain of the at least one switched capacitor amplifier stage based upon a digital gain control word; and
   a processor for determining the digital gain control word based upon an output of said ADC.

13. A circuit according to claim 12 wherein a first one of said at least one switched capacitor amplifier stage is configured for open loop sampling.

14. A circuit according to claim 12 wherein said at least one switched capacitor amplifier stage comprises a plurality of switched capacitor amplifier stages, a first switched capacitor amplifier stage for receiving the analog input signal, a last switched capacitor amplifier stage connected to said ADC.

15. A circuit according to claim 12 wherein said gain control interface means comprises latching and aligning means for latching and aligning the digital gain control word to said plurality of switched capacitor amplifier stages.

16. A circuit according to claim 12 further comprising a clock operatively connected to said ADC and said plurality of switched capacitor amplifier stages so that gain control word changes cause relatively rapid changes in the overall gain based upon said clock.

17. A circuit according to claim 12 wherein each of said switched capacitor amplifiers comprises:
   an amplifier;
   a plurality of capacitors connectable to at least one input of said amplifier; and
   at least one switch for selectively connecting each of said plurality of capacitors responsive to said gain control interface means.

18. A circuit according to claim 17 wherein said plurality of capacitors comprise first and second capacitors having a predetermined ratio to thereby provide corresponding selectable first and second gains.

19. A circuit according to claim 17 wherein said plurality of capacitors comprise first and second capacitors having a common value to thereby provide selectable gains of one and two.

20. A circuit according to claim 12 wherein said processor comprises ADC range optimizing means for determining the digital gain control word so as to use a relatively large range of said ADC.

21. A circuit according to claim 12 wherein said processor comprises noise reduction means for generating a digital gain control word to increase the gain of earlier switched capacitor amplifier stages for reducing noise when an increase in the overall gain is desired, and for generating the digital gain control word so as to decrease the gain of latter switched capacitor amplifier stages for reducing noise when a decrease in the overall gain is desired.

22. A circuit according to claim 12 further comprising offset cancellation means downstream from said ADC for cancelling an offset; and wherein said processor further comprises offset cancellation control means for controlling said offset cancellation means for cancelling offsets based upon gain changes.

23. A circuit according to claim 12 further comprising an integrated circuit substrate on which said ADC and said plurality of switched capacitor amplifiers are formed so that said circuit is a monolithic integrated circuit.

24. A circuit for performing an analog-to-digital conversion and for controlling a gain of an analog input signal upstream of the analog-to-digital conversion, said circuit comprising:
   an analog-to-digital converter (ADC);
   a plurality of switched capacitor amplifier stages connected together in series, a first switched capacitor amplifier stage for receiving the analog input signal, a last switched capacitor amplifier stage connected to said ADC, each of said plurality of switched capacitor amplifier stages having a selectable gain to permit control of an overall gain of the analog input signal upstream of said ADC;
   gain control interface means for controlling the gain of each of said plurality of switched capacitor amplifier stages based upon a digital gain control word; and a processor for determining the digital gain control word based upon an output of said ADC.

25. A circuit according to claim 24 wherein the first switched capacitor amplifier stage is configured for open loop sampling.

26. A circuit according to claim 24 wherein said gain control interface means comprises latching and aligning means for latching and aligning the digital gain control word to said plurality of switched capacitor amplifier stages.

27. A circuit according to claim 24 further comprising a clock operatively connected to said ADC and said plurality of switched capacitor amplifier stages so that gain control word changes cause relatively rapid changes in the overall gain based upon said clock.

28. A circuit according to claim 24 wherein each of said switched capacitor amplifiers comprises:
 an amplifier;
 a plurality of capacitors connectable to at least one input of said amplifier; and
 at least one switch for selectively connecting each of said plurality of capacitors responsive to said gain control interface means.

29. A circuit according to claim 28 wherein said plurality of capacitors comprise first and second capacitors having a predetermined ratio to thereby provide corresponding selectable first and second gains.

30. A circuit according to claim 28 wherein said plurality of capacitors comprise first and second capacitors having a common value to thereby provide selectable gains of one and two.

31. A circuit according to claim 24 wherein said processor comprises ADC range optimizing means for determining the digital gain control word so as to use a relatively large range of said ADC.

32. A circuit according to claim 24 wherein said processor comprises noise reduction means for generating a digital gain control word to increase the gain of earlier switched capacitor amplifier stages for reducing noise when an increase in the overall gain is desired, and for generating the digital gain control word so as to decrease the gain of latter switched capacitor amplifier stages for reducing noise when a decrease in the overall gain is desired.

33. A circuit according to claim 28 further comprising offset cancellation means downstream from said ADC for cancelling an offset; and wherein said processor further comprises offset cancellation control means for controlling said offset cancellation means for cancelling offsets based upon gain changes.

34. A circuit according to claim 24 further comprising an integrated circuit substrate on which said ADC and said plurality of switched capacitor amplifiers are formed so that said circuit is a monolithic integrated circuit.

35. A method for performing an analog-to-digital conversion and for controlling a gain of an analog input signal upstream of the analog-to-digital conversion, the method comprising the steps of:
 performing analog-to-digital conversion;
 providing at least one switched capacitor amplifier stage operatively connected between the analog input signal upstream of the analog-to-digital conversion, said at least one switched capacitor amplifier-stage having a selectable gain;
 controlling the gain of the at least one switched capacitor amplifier stage through a digital gain control interface means based upon a digital gain control word; and
 determining the digital gain control word using a processor based upon an output upstream of the analog-to-digital conversion.

36. A method according to claim 35 further comprising the step of configuring a first one of the at least one switched capacitor amplifier stage for open loop sampling.

37. A method according to claim 35 wherein the step of selecting comprises selecting the gain based upon a clock.

38. A method according to claim 35 wherein the step of selecting comprises selecting the gain so as to use a relatively large range for the analog-to-digital conversion.

39. A method according to claim 35 wherein the step of providing at least one switched capacitor amplifier comprises providing a plurality of switched capacitor amplifiers connected together in series.

40. A method according to claim 39 wherein the step of selecting comprises selecting the gains of earlier switched capacitor amplifier stages for reducing noise when an increase in the overall gain is desired, and selecting the gains of latter switched capacitor amplifier stages for reducing noise when a decrease in the overall gain is desired.

41. A method according to claim 35 further comprising the steps of:
 cancelling an offset downstream from the analog-to-digital conversion; and
 controlling the offset cancelling based upon gain changes.

* * * * *